(12) United States Patent
Arvin et al.

(10) Patent No.: US 8,742,578 B2
(45) Date of Patent: Jun. 3, 2014

(54) SOLDER VOLUME COMPENSATION WITH C4 PROCESS

(75) Inventors: Charles L. Arvin, Poughkeepsie, NY (US); Eric D. Perfecto, Poughkeepsie, NY (US); Wolfgang Sauter, Hinesburg, VT (US); Jennifer D. Schuler, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/552,792

(22) Filed: Jul. 19, 2012

(65) Prior Publication Data

US 2014/0021607 A1    Jan. 23, 2014

(51) Int. Cl.
  *H01L 23/48* (2006.01)
(52) U.S. Cl.
  USPC ............... 257/738; 257/737; 257/E23.021; 257/E23.069; 257/E21.508
(58) Field of Classification Search
  USPC ............... 257/737, 738, E23.021, E23.069, 257/E21.508; 228/180.22; 438/612–613
  See application file for complete search history.

(56) References Cited

U.S. PATENT DOCUMENTS

| | | | |
|---|---|---|---|
| 3,361,592 A | 1/1968 | Quetsch, Jr. et al. | |
| 4,187,599 A | 2/1980 | Flowers et al. | |
| 5,410,184 A * | 4/1995 | Melton et al. | 257/772 |
| 6,133,134 A | 10/2000 | Mehr | |
| 6,549,413 B2 | 4/2003 | Karnezos et al. | |
| 7,241,641 B2 | 7/2007 | Savastiouk et al. | |
| 7,459,386 B2 | 12/2008 | Tseng et al. | |
| 7,560,308 B2 | 7/2009 | Banno et al. | |
| 7,723,158 B2 | 5/2010 | Gutt et al. | |
| 7,829,380 B2 | 11/2010 | Irsigler et al. | |
| 7,951,699 B2 | 5/2011 | Iwasaki et al. | |
| 2003/0134233 A1 | 7/2003 | Su et al. | |
| 2004/0251560 A1 | 12/2004 | Nakano et al. | |
| 2005/0020050 A1 | 1/2005 | Huang | |
| 2005/0085062 A1 | 4/2005 | Kim | |
| 2009/0102062 A1 | 4/2009 | Sato et al. | |
| 2010/0314756 A1 | 12/2010 | Lii et al. | |
| 2011/0189848 A1 | 8/2011 | Ewert et al. | |
| 2013/0087910 A1* | 4/2013 | Abdul Razak | 257/737 |
| 2013/0119532 A1* | 5/2013 | Lin et al. | 257/737 |

OTHER PUBLICATIONS

Anonymous, "Method for fine and ultra-fine mixed-pitch C4 substrate bumping using electroplating," Jul. 2006, 5 pages, Disclosure No. IPCOM000138230D, http://www.ip.com/pubview/IPCOM000138230D.

Nguyen, Office Action Communication for U.S. Appl. No. 13/552,788 dated Sep. 27, 2013, 22 pages.

* cited by examiner

*Primary Examiner* — Jasmine Clark
(74) *Attorney, Agent, or Firm* — David A. Cain; Hoffman Warnick LLC

(57) ABSTRACT

An integrated circuit (IC) chip including solder structures for connection to a package substrate, an IC chip package, and a method of forming the same are disclosed. In an embodiment, an IC chip is provided comprising a wafer having a plurality of solder structures disposed above the wafer. A ball limiting metallurgy (BLM) layer is disposed between each of the plurality of solder structures and the wafer. At least one of the plurality of solder structures has a first diameter and a first height, and at least one other solder structure has a second diameter and a second height. The differing heights and volumes of solder structures facilitate solder volume compensation for chip join improvement on the IC chip side rather than the package side.

10 Claims, 9 Drawing Sheets

SOLDER VOLUME COMPENSATION WITH C4 PROCESS

FIELD

The disclosure relates generally to semiconductor chip packages, and more particularly to controlled collapse chip connections (C4s) having solder semiconductor chip side solder volume compensation, for joining a semiconductor chip package substrate and a semiconductor chip.

BACKGROUND

A semiconductor chip, also commonly referred to as an integrated circuit (IC) chip or a die is typically assembled into a semiconductor chip package that is soldered to a printed circuit board. One type of semiconductor chip package is a flip chip, also known as a C4 package. The semiconductor chip package typically includes the IC chip, which contains a number of round solder bumps that are attached to a top surface of the chip. The IC chip, via the solder bumps, is soldered to solder pads located along a surface of a package substrate, forming a metallurgical joint between the chip and the substrate referred to as a C4. C4s carry electrical current between the semiconductor chip and the substrate.

The final metallurgical composition of a C4 is the combined result of the volumes and compositions of the solder bump on the IC chip and the solder pads on the package substrate. As the pitch is reduced, the solder bump dimensions on the IC chip are reduced. The package substrate solder pads typically account for about one third of the total solder volume of the final C4; the other two thirds comes from the solder bumps on the IC chip itself. For finer and finer pitch, such as required by 14 nm technology and beyond, the volume balance tends to shift from about a 2:1 ratio to about a 1:1 ratio of solder on the IC chip to solder on the package side. Thus, at fine pitches, it becomes advantageous to control package side solder volume in order to satisfactorily control the metallurgical composition of the final C4. The size reduction of the solder pads on the package substrate is limited, however, by the manufacturing constraints of the package manufacturing processes, which are coarser than manufacturing processes on the IC chip side.

Another factor in chip packing fabrication is the coefficient of thermal expansion (CTE) of the package substrate and the IC chip. The package substrate is typically constructed from a composite material which has a higher CTE than the CTE for the semiconductor chip. As a result, the IC chip expands relatively slowly in comparison to the package substrate, which expands relatively quickly under heat during chip join processes.

One method of compensating for the differences in CTE has been to compensate for the differing CTEs with adjusted solder volumes on the package side. In this process, the locations and volume of package solder pads are adjusted to improve chip join yields. Since the solder composition on the package side is typically standardized, compensating for differences in CTE with package side solder adjustments produces the undesirable effect of increasing the variability in solder volume in the resulting C4, and therefore the final metallurgical composition of the C4. This has implications for the strength and stiffness of the chip joint, among other attributes.

BRIEF DESCRIPTION

Aspects of the invention provide an IC chip, an IC chip package, and a method of fabricating the same, which do not require package-side solder volume compensation.

A first aspect of the disclosure provides an integrated circuit (IC) chip comprising: integrated circuit (IC) chip comprising a wafer and a plurality of solder structures disposed above the wafer. A ball limiting metallurgy (BLM) layer may be disposed between each of the plurality of solder structures and the wafer, wherein at least one of the plurality of solder structures has a first diameter and a first height, and at least one distinct one of the plurality of solder structures has a second diameter and a second height.

A second aspect of the disclosure provides an integrated circuit (IC) chip package comprising: a wafer and a plurality of controlled collapse chip connections (C4s) disposed above the wafer. At least one of the plurality of C4s has a first volume, and at least one distinct one of the plurality of C4s has a second volume. A ball limiting metallurgy (BLM) layer is disposed between each of the plurality of C4s and the wafer; and a package substrate disposed above the plurality of C4s, and connected to the wafer by the plurality of C4s.

A third aspect of the disclosure provides a method comprising: providing an integrated circuit (IC) chip; depositing a ball limiting metallurgy (BLM) layer over a surface of the IC chip; depositing a resist layer over the BLM layer; and patterning the resist layer to create a plurality of openings in the resist layer. At least one opening in the plurality of openings has a first diameter, and at least one distinct opening in the plurality of openings has a second diameter. Following the patterning of the resist layer, a solder structure is deposited in each of the plurality of openings in the resist layer, wherein the at least one solder structure deposited in the at least one opening having the first diameter, and the at least one solder structure deposited in the at least one opening having the second diameter are deposited to a same height. The resist layer is then stripped, an exposed portion of the BLM layer is etched, and the plurality of solder structures are reflowed.

These and other aspects, advantages and salient features of the invention will become apparent from the following detailed description, which, when taken in conjunction with the annexed drawings, where like parts are designated by like reference characters throughout the drawings, disclose embodiments of the invention.

DETAILED DESCRIPTION

As indicated above, aspects of the invention provide an IC chip including solder structures having varied solder volumes, an IC chip package in which these solder structures form controlled collapse chip connections (C4s), and a method for forming C4s having varied solder volumes.

Turning to the figures, with reference to FIGS. 1-8, a method of fabricating an integrated circuit (IC) chip 1 including solder structures on an upper surface thereof, and further of forming an IC chip package, are provided.

Figure 1:
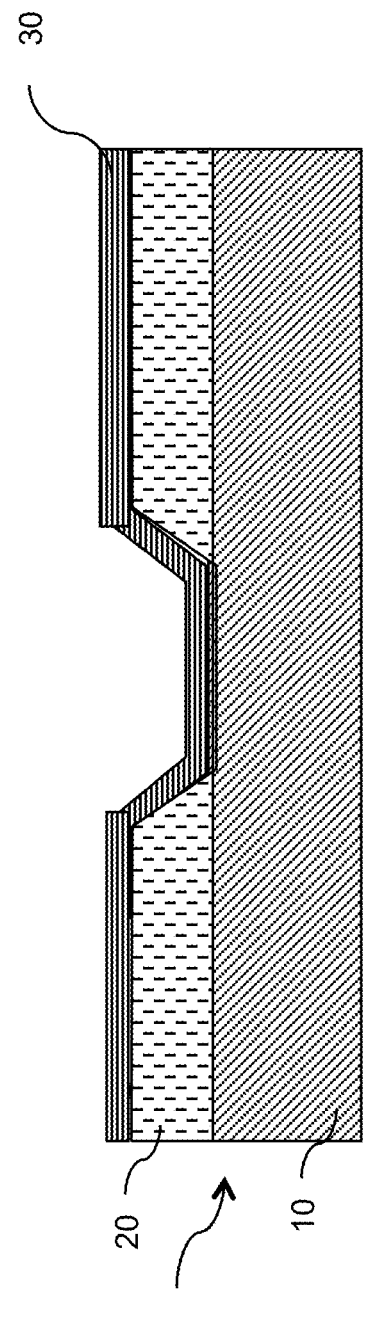
FIGS. 1-5 show steps in a method of forming a IC chip having solder structures in accordance with an embodiment of the disclosure.

As shown in FIG. 1, an IC chip 1 is provided. IC chip 1 may include a number of electronic circuits manufactured by lithographic processes or patterned diffusion of trace elements into the surface of a wafer 10 in a conventional manner. IC chip 1 may further include a polyimide passivation layer 20 deposited over wafer 10. A ball limiting metallurgy (BLM) layer 30 may be deposited on an upper surface of IC chip 1, which may in various embodiments comprise TiW or Ti, nickel, copper, or other metals In some embodiments, BLM layer 30 may comprise two or more layers, having differing compositions.

Figure 2:
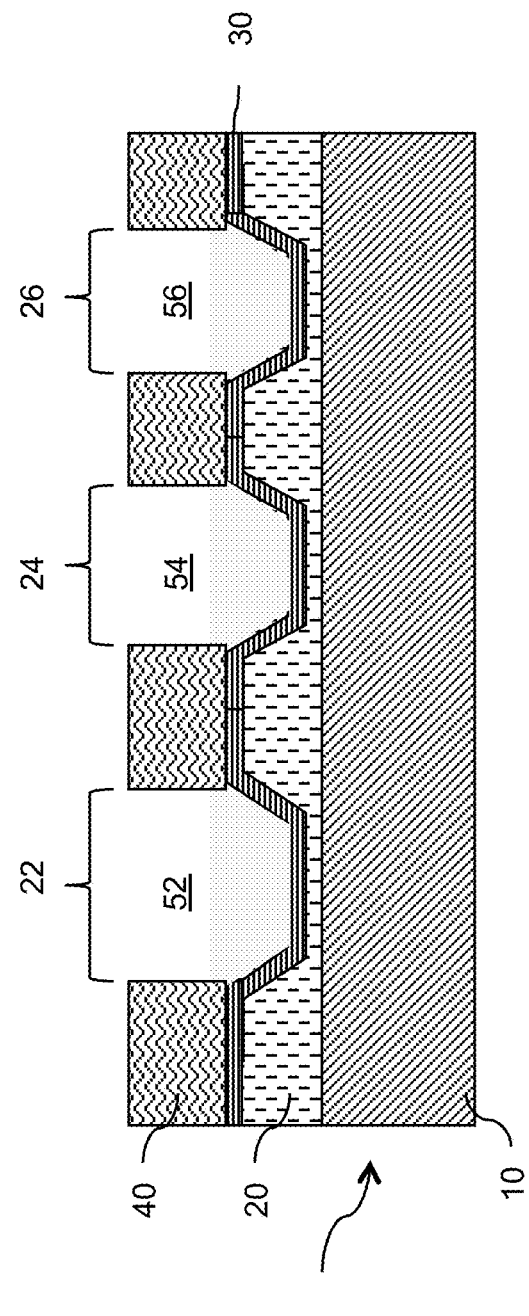

As shown in FIG. 2, a resist layer 40 may be deposited over BLM layer 30. Resist layer 40 may then be patterned to create a plurality of openings 52, 54, 56 . . . n in resist layer 40. Openings 52, 54, 56 . . . n may be substantially round. As shown in FIG. 2, first opening 52 has a first diameter, and second opening 54 has a second diameter. First diameter 52 is greater than the second diameter 54. In some embodiments, a third opening 56 may have a third diameter 26, which may be smaller than both of first diameter 22 and second diameter 24.

Figure 3:
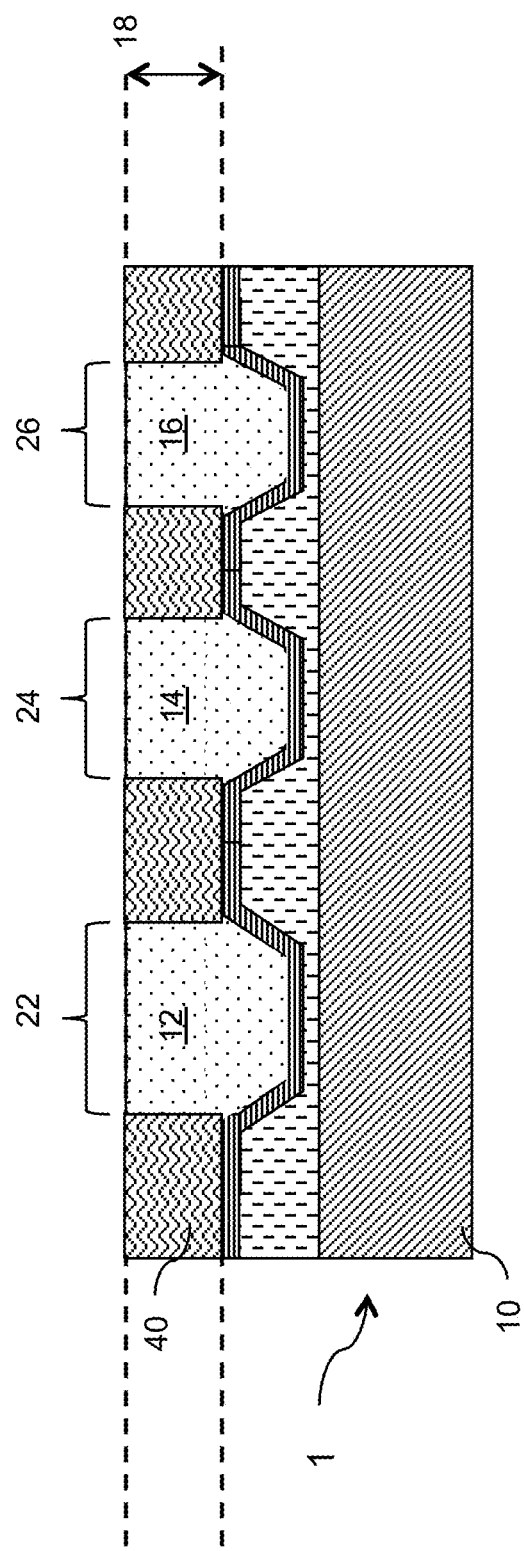
Figure 4:
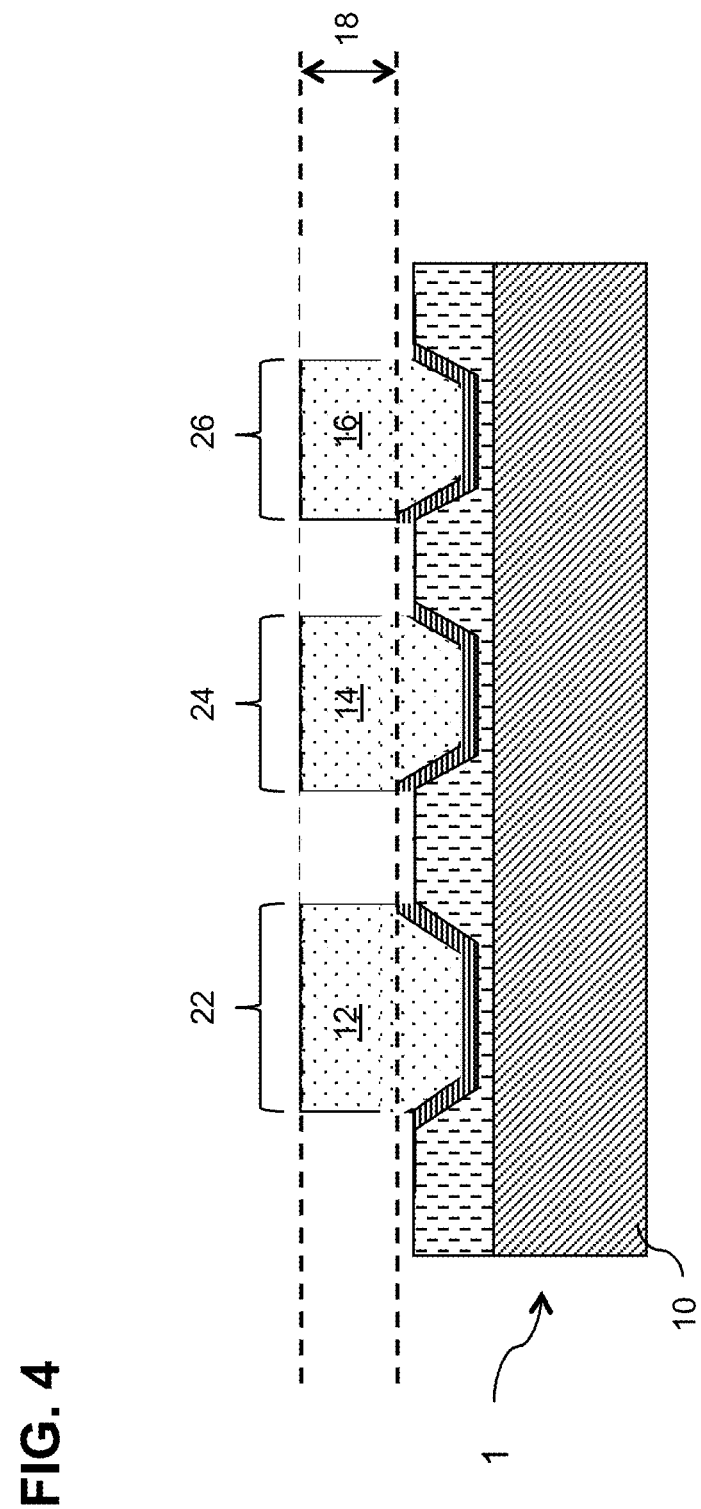

As shown in FIG. 3, solder structures 12, 14, 16 . . . n are deposited in each of the plurality of openings 52, 54, 56 . . . n (FIG. 2) in resist layer 40. At least one solder structure 12 is deposited in opening 52 having the first diameter 22, and at least one solder structure 14 is deposited in an opening 14 having second diameter 24. In embodiments including a third opening 56 having a third diameter 26, a solder structure 16 may be deposited therein. In any event, solder structures 12, 14, 16 . . . n are deposited to a same depth, such that each of solder structures 12, 14, 16 . . . n has the same height 18 upon completion of deposition.

Figure 8:
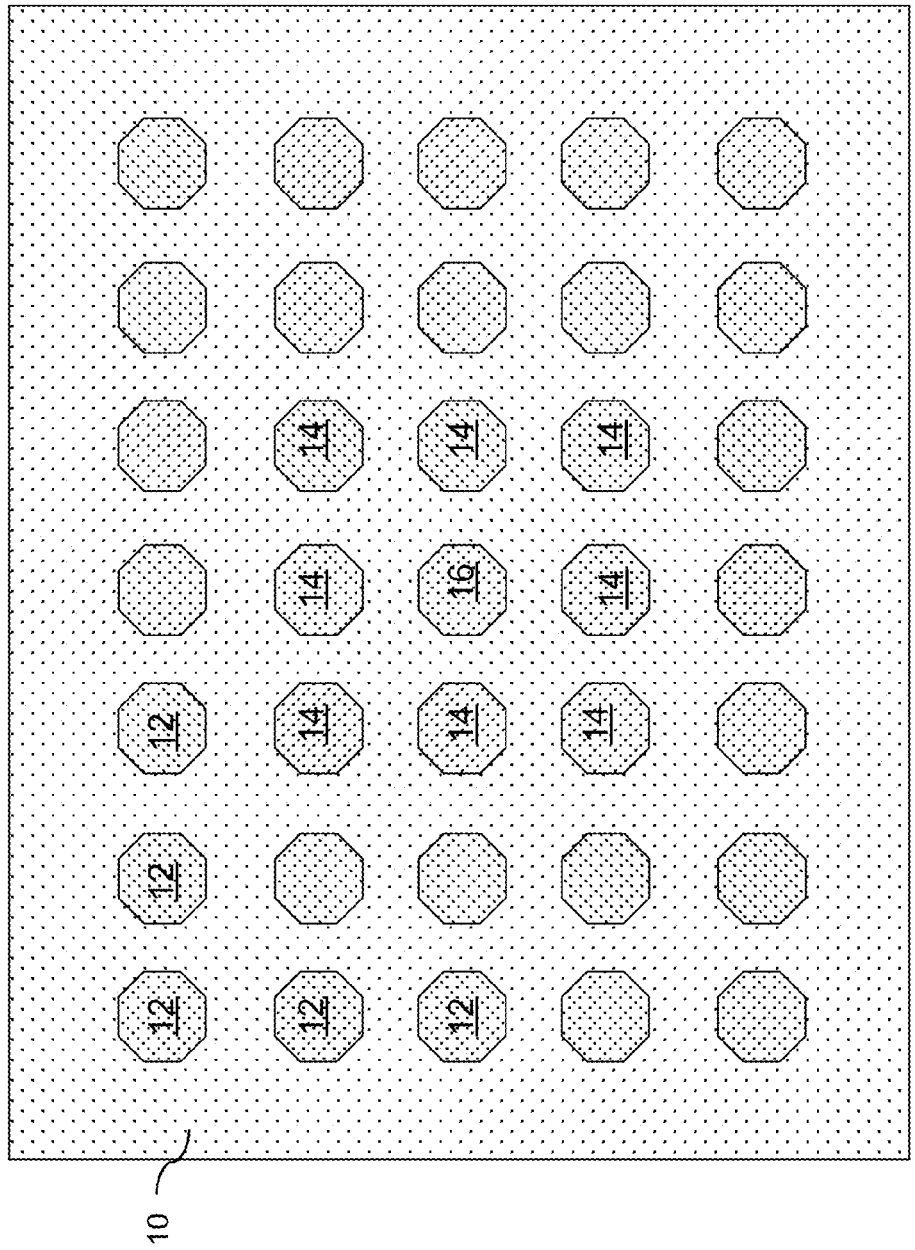
FIG. 8 shows an IC chip having solder structures in accordance with an embodiment of the disclosure.

Solder structures 12, 14, 16 . . . n may be arranged in a plurality of rows on wafer 10 as shown in FIG. 8. In some embodiments, openings 52 (FIG. 2) having the larger first diameter 22 (FIGS. 2-3) for forming solder structures 12 are disposed on a number of outer rows in the plurality of rows. Openings 54 (FIG. 2) having second diameter 24 (FIGS. 2-3) for forming solder structures 14 may be disposed on an interior of IC chip 10, and openings 56 having third diameter 26 (FIGS. 2-3) for forming solder structures 16 may be disposed near a core of the IC chip. Varying quantities of each size solder structure may be employed in accordance with the size requirements for the eventual C4 in the IC chip package.

Resist layer 40 is then stripped, and the exposed portions of BLM layer 30 are etched, such that BLM layer 30 only remains beneath solder structures 12, 14, 16 . . . n. Solder structures 12, 14, 16 . . . n are then reflowed as shown in FIG. 5, resulting in solder structures 12, 14, 16 . . . n that are substantially spherical, or have a substantially spherical upper surface.

Figure 5:
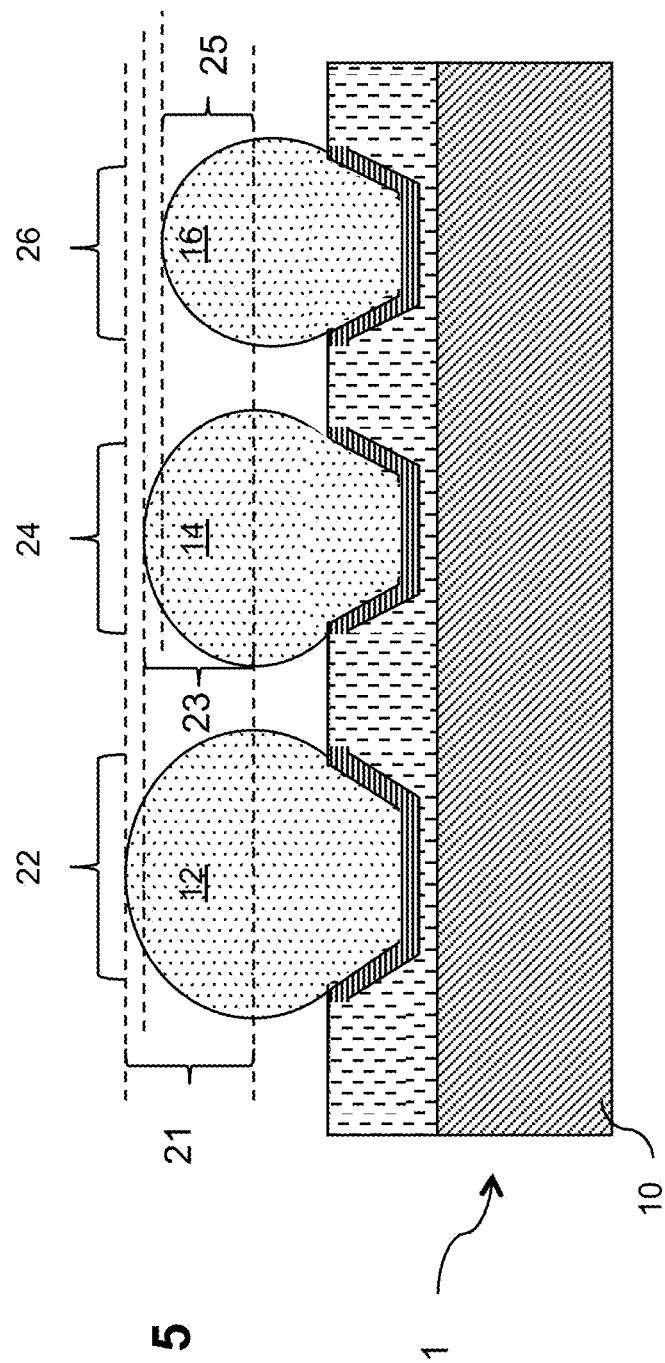

After reflowing, solder structures 12, 14, 16 . . . n, which previously had the same height 18 regardless of diameter 22, 24, 26 (FIGS. 3-4), take on a new shape and dimension (FIG. 5). Because first solder structure 12 has a larger diameter 22 and the same height 18 relative to second and third solder structures 14, 16, it has a greater solder volume. When this greater solder volume is reflowed and assumes a spherical or semi-spherical shape, it has a height 21 which is taller than the height 23 of second solder structure 14. Similarly, second solder structure 14, which has a larger diameter 24 and the same height 18 as compared to third solder structure 16, achieves a reflowed height 23 that is greater than the reflowed height of third solder structure 16, which has height 25.

Figure 6:
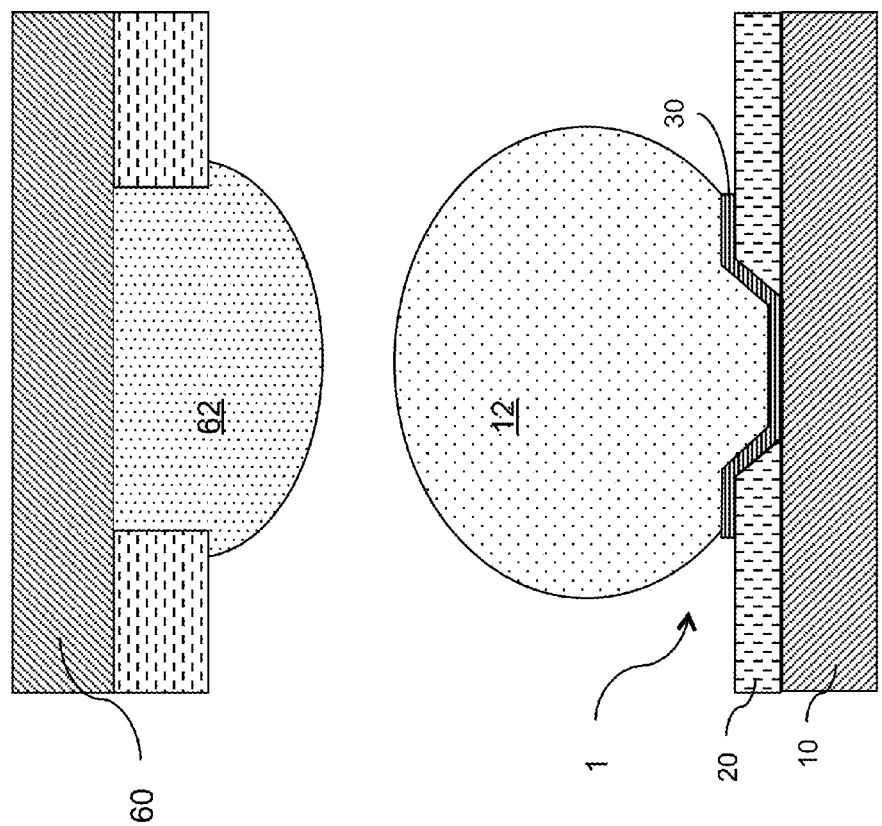
FIGS. 6-7 show steps in a method of packaging an IC chip using controlled collapse chip connections (C4s) in accordance with an embodiment of the disclosure.
Figure 7:
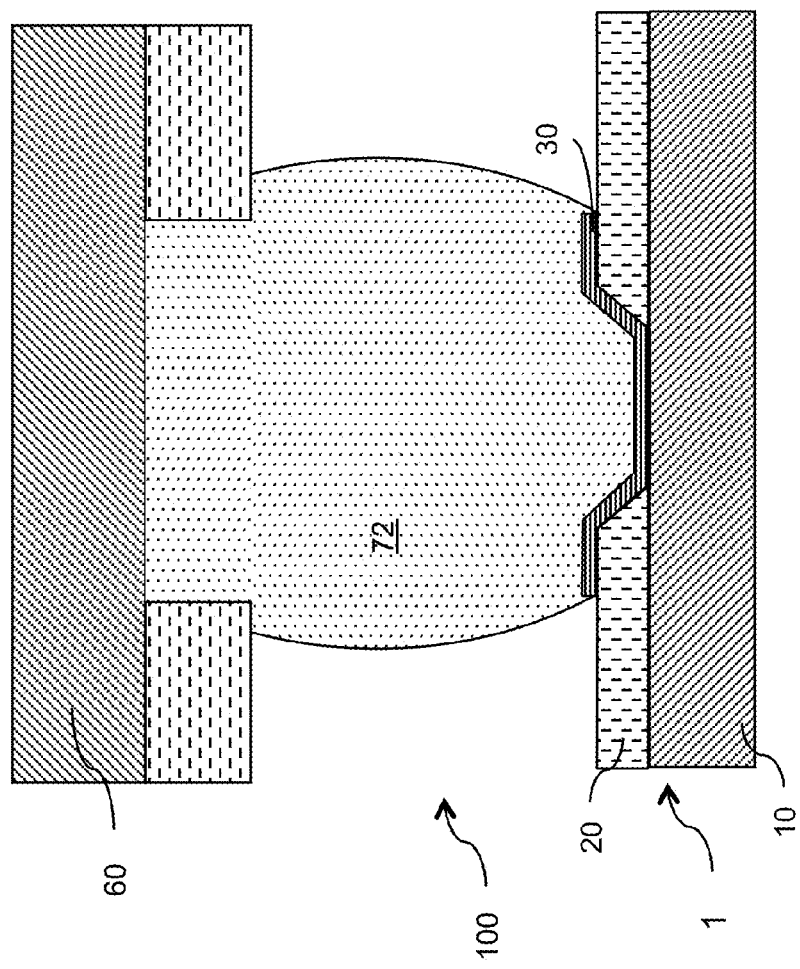
Figure 9:
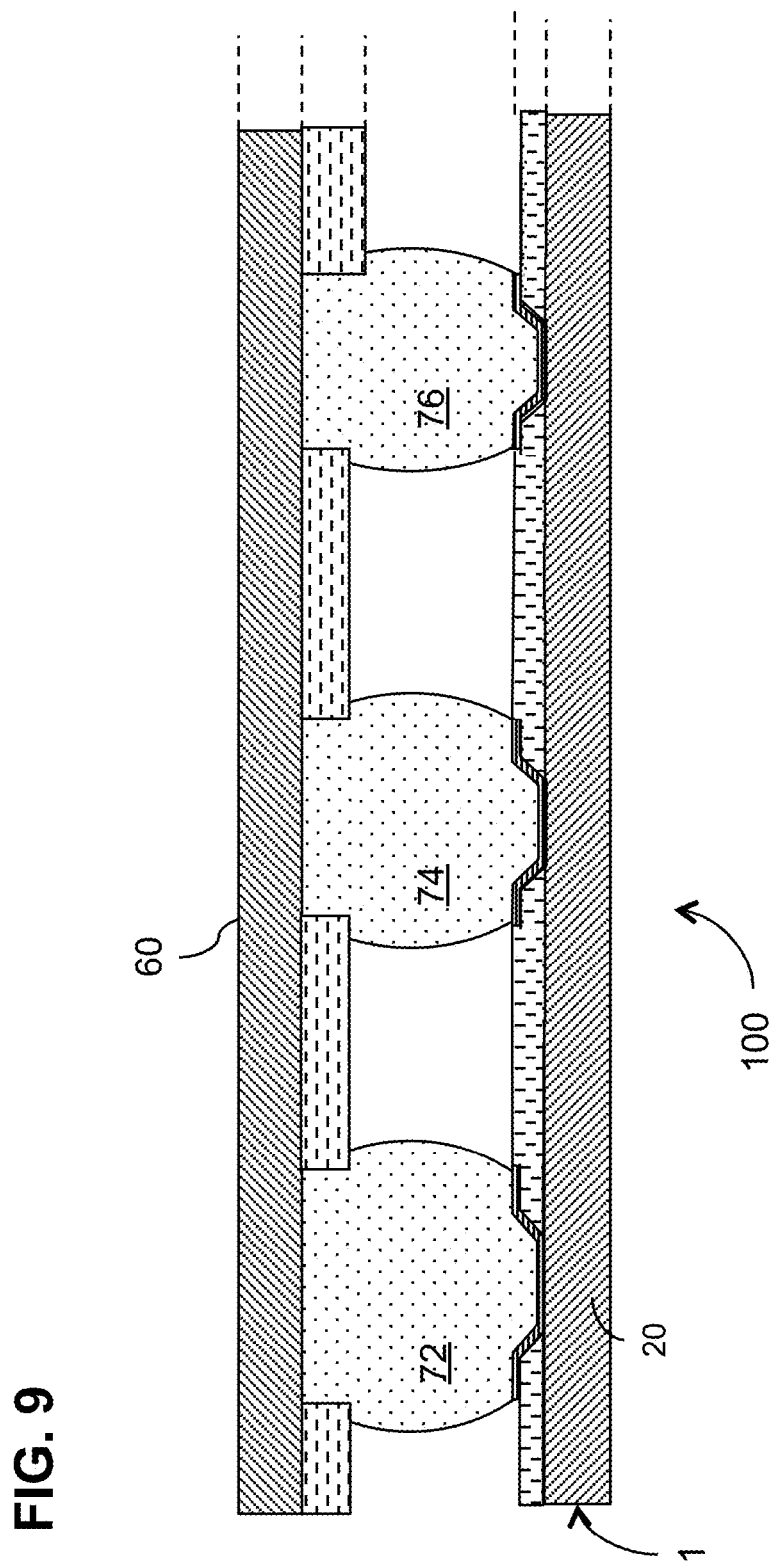
FIG. 9 shows a portion of an IC chip package in accordance with an embodiment of the disclosure.

As shown in FIGS. 6-7, following reflowing, IC chip 1 is joined to package substrate. Package 60 substrate, which includes a plurality of solder pads 62 disposed on a surface of the package substrate 60, is placed on an upper surface of the plurality of solder structures 12, 14, 16 . . . n (solder structure 12 shown in FIG. 6). Each of the plurality of solder pads 62 is substantially uniform in volume of solder and in metallurgical properties. In particular, each solder pad 62 may comprise about 3% silver. Solder pads 62 are arranged on the surface of package 60 such that when package 60 is placed in contact with IC chip 1, solder structures 12, 14, 16 . . . n on IC chip 1 contact solder pads 62 on package 60 (FIGS. 7, 9).

Solder structures 12, 14, 16 . . . n and solder pads 62 are then reflowed to form a plurality of controlled collapse chip connections (C4s) 72, 74, 76 . . . n, which join the IC chip to package 60 substrate. The resulting C4s 72, 74, 76 . . . n have metallurgical properties that are the result of the compositions of both the solder pad 62 and the solder structure 12, 14, 16 . . . n which were reflowed to form the C4. Accordingly, the metallurgical properties and the size, including height and volume, of C4s 72, 74, 76 . . . n vary as a function of the silver content of solder structure 12, 14, 16 . . . n, and the volume of solder structure 12, 14, 16 . . . n. Many embodiments include solder pads 62 which are standardized in volume and Ag content. Therefore, the silver content and other metallurgical properties of the C4s 72, 74, 76 . . . n are substantially dependent on the silver content and the solder volume of the solder structures 12, 14, 16 . . . n on the IC chip 1. For example, C4 72 may have a different percentage of Ag content than C4 74 or C4 76. In various embodiments, despite variations in Ag content between C4s, each of the resulting C4s 72, 74, 76 . . . n contains about 1.6% silver or less.

In addition to the foregoing method, an IC chip and IC chip package are provided in accordance with embodiments of the invention.

With reference to FIG. 6, an integrated circuit (IC) chip 1 is provided. IC chip 1 includes a wafer 10, and a plurality of solder structures 12, 14, 16 . . . n disposed above the wafer. A ball limiting metallurgy (BLM) layer 30 may be disposed between each of the plurality of solder structures 12, 14, 16 . . . n (12 shown in FIG. 6) and wafer 10. BLM layer 30 may include more than one layer as described above.

With reference to FIG. 5, at least one solder structure 12 disposed on wafer 10 has a first diameter 22 and a first height 21, and at least one other solder structure 14 has a second diameter 24 and a second height 23. First diameter 22 is greater than second diameter 24, and similarly, first height 21 is greater, or taller than, second height 23. Accordingly, the volume of the solder structure 12 having first diameter 22 and first height 21 is greater than the volume of the second solder structure 14 having second diameter 24 and second height 23. In some embodiments, at least a third solder structure 16 may have a third diameter 26 and a third height 25. Third diameter 26 is smaller than both of first diameter 22 and second diameter 24. Likewise, third height 25 is smaller or shorter than both of first height 21 and second height 23, resulting in a smaller volume for third solder structure 16 than either of first or second solder structures 12, 14. Regardless of size, each of the solder structures 12, 14, 16 . . . n on wafer 10 may be substantially spherical, or have a substantially spherical upper surface following reflowing.

As shown in FIG. 8, solder structure 12, which may have the largest volume, may be disposed near a periphery of an IC chip of wafer 10, and solder structure 14, having a smaller volume, may be disposed on an interior of IC chip 1. In embodiments that include a still smaller solder structure 16, these structure(s) may be disposed nearest to the core of IC chip 1, relative to larger solder structures 12, 14. Various quantities and arrangements of solder structures 12, 14, 16 . . . n may be used depending on the requirements of the chip package, described further below.

As shown in FIG. 9, an IC chip package 100 is further provided, including the above-described IC chip 1. Solder structures 12, 14, 16 . . . n (FIGS. 5-6) are incorporated into controlled collapse chip connections (C4s) 72, 74, 76 . . . n disposed above wafer 1 (FIG. 9), and connecting wafer 10 to a package substrate 60 disposed above the plurality of C4s.

A first C4 72 has a first volume, and a second C4 74 may have a second volume. Some embodiments may further include a third C4 76 having a third volume. In order of descending volumes, first volume is larger than second volume, is larger than third volume. The volumes of each C4 are equal to the combined volumes of the solder structure 12, 14, 16 . . . n and the solder pad 62 which were reflowed to form the particular C4. Because solder pads 62 on package substrate 60 may be substantially consistent in volume and metallurgical composition throughout package 60, the silver content of each of the final C4s is a function of the volume and the silver content of each solder structure 12, 14, 16 . . . n on IC chip 1, and the volume and the silver content of each solder pad 62. In various embodiments, the solder volume of each solder pad 62 may be about 200,000 cubic micrometers ($\mu m^3$) or 140,000 $\mu m^3$, and a silver content each solder pad is about 3%. In one embodiment, each of the plurality of C4s 72, 74, 76 . . . n contains about 1.6% silver or less.

As used herein, the terms "first," "second," and the like, do not denote any order, quantity, or importance, but rather are used to distinguish one element from another, and the terms "a" and "an" herein do not denote a limitation of quantity, but rather denote the presence of at least one of the referenced item. The modifier "about" used in connection with a quantity is inclusive of the stated value and has the meaning dictated by the context (e.g., includes the degree of error associated with measurement of the particular quantity). The suffix "(s)" as used herein is intended to include both the singular and the plural of the term that it modifies, thereby including one or more of that term (e.g., the metal(s) includes one or more metals). Ranges disclosed herein are inclusive and independently combinable (e.g., ranges of "up to about 25 mm, or, more specifically, about 5 mm to about 20 mm," is inclusive of the endpoints and all intermediate values of the ranges of "about 5 mm to about 25 mm," etc.).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit (IC) chip comprising:
a wafer;
a plurality of solder structures disposed above the wafer; and
a ball limiting metallurgy (BLM) layer disposed between each of the plurality of solder structures and the wafer,
wherein at least one of the plurality of solder structures has a first diameter and a first height, and at least one distinct one of the plurality of solder structures has a second diameter and a second height, the first diameter and the first height being greater, respectively, than the second diameter and the second height,
wherein the solder structure having the first diameter and the first height includes more silver than the solder structure having the second diameter and the second height.

2. The IC chip of claim 1, wherein each of the plurality of solder structures are substantially spherical.

3. The IC chip of claim 1, wherein the at least one of the plurality of solder structures having the first height and the first diameter is disposed near a periphery of the IC chip, and
wherein the at least one of the plurality of solder structures having the second height and the second diameter is disposed near an interior of the IC chip.

4. The IC chip of claim 1, wherein at least one further distinct one of the plurality of solder structures has a third diameter and a third height, wherein the third diameter is smaller than the first diameter and the second diameter, and the third height is smaller than the first height and the second height.

5. An integrated circuit (IC) chip package comprising:
a wafer;
a plurality of controlled collapse chip connections (C4s) disposed above the wafer,
wherein at least one of the plurality of C4s has a first volume, and at least one distinct one of the plurality of C4s has a second volume, the first volume being greater than the second volume;
a ball limiting metallurgy (BLM) layer disposed between each of the plurality of C4s and the wafer; and
a package substrate disposed above the plurality of C4s, and connected to the wafer by the plurality of C4s,
wherein a silver content of each of the plurality of C4s is a function of a volume and a silver content of each of a solder structure on the IC chip and a solder pad on the package substrate,
wherein the silver content and the volume of the solder pad are substantially the same for each of the plurality of C4s, and
wherein the C4 having the first volume and the C4 having the second volume do not have the same silver content.

6. The IC chip package of claim 5, wherein each of the plurality of C4s contains about 1.6% silver or less.

7. The IC chip package of claim 5,
wherein the volume of the solder pad is about 140,000 $\mu m^3$, and
the silver content of the solder pad is about 3%.

8. The IC chip package of claim 5, wherein the at least one solder structure having the first volume is disposed near a periphery of the IC chip, and
wherein the at least one distinct solder structure having the second volume is disposed near an interior of the IC chip.

9. The IC chip package of claim 5, wherein at least one further distinct one of the plurality of solder structures has a third volume, wherein the third volume is smaller than the first volume and the second volume.

10. The IC chip package of claim 9, wherein the at least one distinct solder structure having the third volume is disposed at an interior-most position relative to the at least one distinct solder structure having the first volume and the at least one distinct solder structure having the second volume.

* * * * *